United States Patent
Hashimoto

(10) Patent No.: US 7,847,616 B2
(45) Date of Patent: Dec. 7, 2010

(54) INVERTER CIRCUIT AND BALANCED INPUT INVERTER CIRCUIT

(75) Inventor: Yasuhiro Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/585,511

(22) Filed: Sep. 16, 2009

(65) Prior Publication Data
US 2010/0007382 A1 Jan. 14, 2010

Related U.S. Application Data

(63) Continuation of application No. PCT/JP2007/055510, filed on Mar. 19, 2007.

(51) Int. Cl.
H03K 3/01 (2006.01)
H01L 29/94 (2006.01)

(52) U.S. Cl. ............ 327/534; 327/537; 327/107; 327/166; 327/176; 257/368; 257/351; 257/371; 257/373

(58) Field of Classification Search ........... 327/107, 327/166, 176, 534, 536, 537; 257/351, 368, 257/371, 373
See application file for complete search history.

(56) References Cited

U.S. PATENT DOCUMENTS

| | | | |
|---|---|---|---|
| 5,821,769 A | 10/1998 | Douseki | |
| 6,040,610 A | 3/2000 | Noguchi et al. | |
| 6,147,386 A * | 11/2000 | Horiuchi | 257/369 |
| 6,300,819 B1 * | 10/2001 | De et al. | 327/534 |
| 6,333,571 B1 * | 12/2001 | Teraoka et al. | 307/125 |
| 6,404,243 B1 * | 6/2002 | Koch et al. | 327/107 |
| 6,468,848 B1 * | 10/2002 | Awaka et al. | 438/199 |
| 6,864,539 B2 * | 3/2005 | Ishibashi et al. | 257/368 |

(Continued)

FOREIGN PATENT DOCUMENTS

JP 03-038917 2/1991

(Continued)

OTHER PUBLICATIONS

Patent Abstract of Japan, Publication No. 09-055439, published date: Feb. 25, 1997.

(Continued)

*Primary Examiner*—Vibol Tan
(74) *Attorney, Agent, or Firm*—Staas & Halsey LLP

(57) ABSTRACT

A balanced input inverter circuit includes a first P-type MOS transistor including a gate terminal connected to an input, a source terminal connected to a first power source potential, and a drain terminal connected to an output, a first N-type MOS transistor including a gate terminal connected to the input, a drain terminal connected to the output, and a source terminal connected to a second power source potential, a first inverter circuit including an input terminal connected to an inverted input, and an output terminal connected to a back gate terminal of the first N-type MOS transistor, a first diode connected between the first power source potential and a first power source terminal of the first inverter circuit, a second inverter circuit including an input terminal connected to the inverted input, and an output terminal connected to a back gate terminal of the first P-type MOS transistor, and a second diode connected between the second power source potential and a second power source terminal of the second inverter circuit.

7 Claims, 11 Drawing Sheets

U.S. PATENT DOCUMENTS

| | | | |
|---|---|---|---|
| 7,005,711 B2 * | 2/2006 | King | 257/368 |
| 7,276,957 B2 * | 10/2007 | Bhattacharya et al. | 327/534 |
| 7,307,233 B2 * | 12/2007 | Nomaru et al. | 204/157.2 |
| 7,312,640 B2 * | 12/2007 | Horiguchi et al. | 326/112 |
| 7,315,196 B2 * | 1/2008 | Wada | 327/536 |
| 7,342,291 B2 * | 3/2008 | Vogelsang | 257/529 |

FOREIGN PATENT DOCUMENTS

| | | |
|---|---|---|
| JP | 5-14168 | 1/1993 |
| JP | 9-121152 | 5/1997 |
| JP | 10-340998 | 12/1998 |
| JP | 3039336 | 3/2000 |
| JP | 2000-312004 | 11/2000 |
| JP | 2003-101407 | 4/2003 |
| JP | 2004-165911 | 6/2004 |

OTHER PUBLICATIONS

International Search Report for PCT/JP2007/055510, mailed Jun. 19, 2007.

* cited by examiner

US 7,847,616 B2

INVERTER CIRCUIT AND BALANCED INPUT INVERTER CIRCUIT

CROSS-REFERENCE TO RELATED APPLICATION

This application is a continuation of PCT international application Ser. No. PCT/JP2007/055510 filed on Mar. 19, 2007 which designates the United States, the entire contents of which are incorporated herein by reference.

FIELD

The embodiments discussed herein are directed to an inverter circuit and a balanced input inverter circuit.

BACKGROUND

Recently, semiconductor products using a metal oxide semiconductor (MOS) transistor and the like are required to achieve a high speed operation and low power consumption at the same time. To achieve a high speed operation, it is preferable to increase a driving current of a transistor. However, when a power source voltage is increased to increase the driving current, the power consumption also increases, and this is against achieving low power consumption. Further, when a space taken by a transistor is enlarged to increase the driving current, the entire area of a circuit increases, and this makes it difficult to achieve downsizing of a semiconductor product.

On the other hand, to increase a driving current of a MOS transistor, it is effective to reduce a threshold voltage between a gate terminal and a source terminal. For this purpose, it is effective to adjust a back gate voltage as a voltage of a substrate of the MOS transistor, and reduce the threshold voltage by a substrate bias effect. For example, Japanese Patent No. 3039336 describes a technique of applying a voltage shifted from a power source as a back gate voltage of a MOS transistor, and reducing a threshold voltage when the MOS transistor is in an operating state.

In a circuit described in Japanese Patent No. 3039336, as depicted in FIG. 21, diodes 30 and 40 are provided between a power source potential and back gate terminals of transistors 10 and 20, respectively. With this arrangement, in an operating state of the MOS transistor 10, a forward current flows to the diode 30, and a back gate voltage of the MOS transistor 10 is shifted from a power source voltage (a positive power source Vdd). Consequently, a threshold voltage of the MOS transistor 10 is reduced and a driving current increases. In an operating state of the MOS transistor 20, a forward current flows to the diode 40, and a back gate voltage of the MOS transistor 20 is shifted from a power source voltage (a negative power source Vss). Consequently, a threshold voltage of the MOS transistor 20 is reduced and a driving current increases.

However, to increase the driving current as described above, a leak current also increases along with the increase of the driving current. That is, when a space taken by a transistor is increased, an element size increases, and this can be a cause of the increase of the leak current.

The leak current also increases when a threshold voltage is reduced by shifting a back gate voltage. Specifically, when a relationship between a gate voltage VG and a current IDS between a drain terminal and a source terminal depicted in FIG. 22 is referred to, for example, it is clear that when a back gate voltage indicated by a solid line in FIG. 22 is low, a driving current is small and a leak current is also small. When a back gate voltage indicated by a broken line in FIG. 22 is at a medium level, a driving current and a leak current are also at medium levels. When a back gate voltage indicated by a dashed line in FIG. 22 is high, a driving current becomes large, but a leak current also becomes large. Particularly, in FIG. 22, because the current IDS is expressed in a logarithmic scale, it is clear that the increase of the leak current along with the increase of the back gate voltage is very large.

As described above, when the back gate voltage is fixedly shifted, a leak current increases as well as a driving current. Therefore, there is a certain limit to improve the driving capacity by reducing the threshold voltage. To dynamically control the back gate voltage, there can be considered a circuit configuration that applies a voltage equal to a gate input voltage of a MOS transistor to a back gate terminal. In this case, however, a forward voltage is generated between the source terminal and the back gate terminal and a current is also generated, and thus it is not realistic to apply the gate input voltage to the back gate terminal.

SUMMARY

According to one aspect of the invention, a balanced input inverter circuit includes: a first P-type MOS transistor including a gate terminal connected to an input, a source terminal connected to a first power source potential, and a drain terminal connected to an output; a first N-type MOS transistor including a gate terminal connected to the input, a drain terminal connected to the output, and a source terminal connected to a second power source potential; a first inverter circuit including an input terminal connected to an inverted input, and an output terminal connected to a back gate terminal of the first N-type MOS transistor; a first diode connected between the first power source potential and a first power source terminal of the first inverter circuit; a second inverter circuit including an input terminal connected to the inverted input, and an output terminal connected to a back gate terminal of the first P-type MOS transistor; and a second diode connected between the second power source potential and a second power source terminal of the second inverter circuit.

According to another aspect of the invention, an inverter circuit includes: a first transistor including a gate terminal connected to an input, a source terminal connected to a first power source potential, and a drain terminal connected to an output; a second transistor having a polarity different from that of the first transistor and including a gate terminal connected to the input, a drain terminal connected to the output, and a source terminal connected to a second power source potential; a first diode connected between a back gate terminal of the first transistor and a back gate terminal of the second transistor; a third transistor including a gate terminal connected to an inverted input, a source terminal connected to the first power source potential, a drain terminal connected to the back gate terminal of the first transistor, and a back gate terminal connected to the first power source potential; and a fourth transistor including a gate terminal connected to the inverted input, a drain terminal connected to a back gate terminal of the second transistor, a source terminal connected to the second power source potential, and a back gate terminal connected to the second power source potential.

According to still another aspect of the invention, an inverter circuit includes: a first transistor including a gate terminal connected to an input, a source terminal connected to a first power source potential, and a drain terminal connected to an output; a second transistor having a polarity different from that of the first transistor and including a gate terminal connected to the input, a drain terminal connected to the output, and a source terminal connected to a second power source potential; a first diode connected between a back gate terminal of the first transistor and a back gate terminal of the second transistor; a third transistor including a gate terminal connected to an inverted input, a source terminal connected to a third power source potential which is higher than the first power source potential, a drain terminal connected to the back gate terminal of the first transistor, and a back gate terminal connected to the third power source potential; and a fourth transistor including a gate terminal connected to the inverted input, a drain terminal connected to a back gate terminal of the second transistor, a source terminal connected to a fourth power source potential which is lower than the second power source potential, and a back gate terminal connected to the fourth power source potential.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Exemplary embodiments of the present invention will be explained below in detail with reference to the accompanying drawings.

[a] First Embodiment

Figure 1:
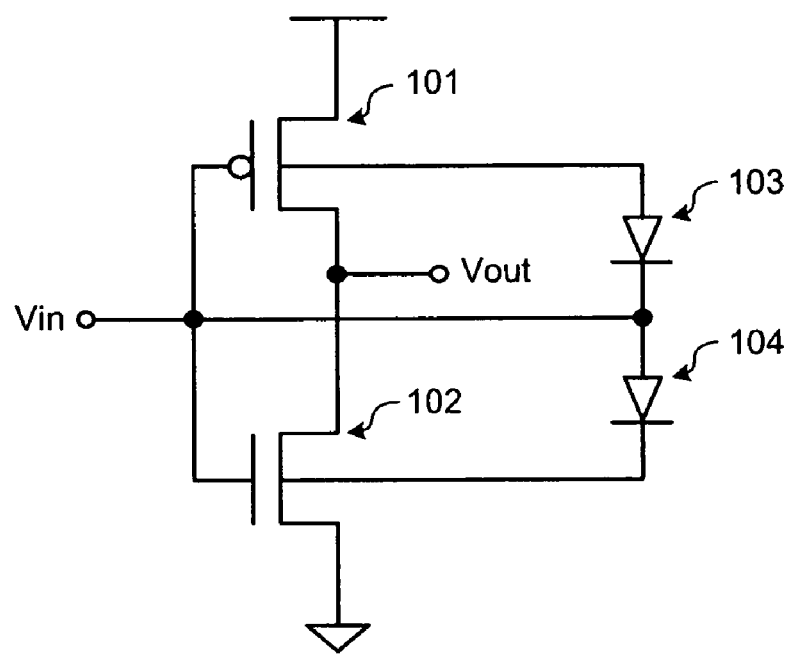
FIG. 1 is a circuit diagram of a configuration of an inverter circuit according to a first embodiment of the present invention.
Figure 2:
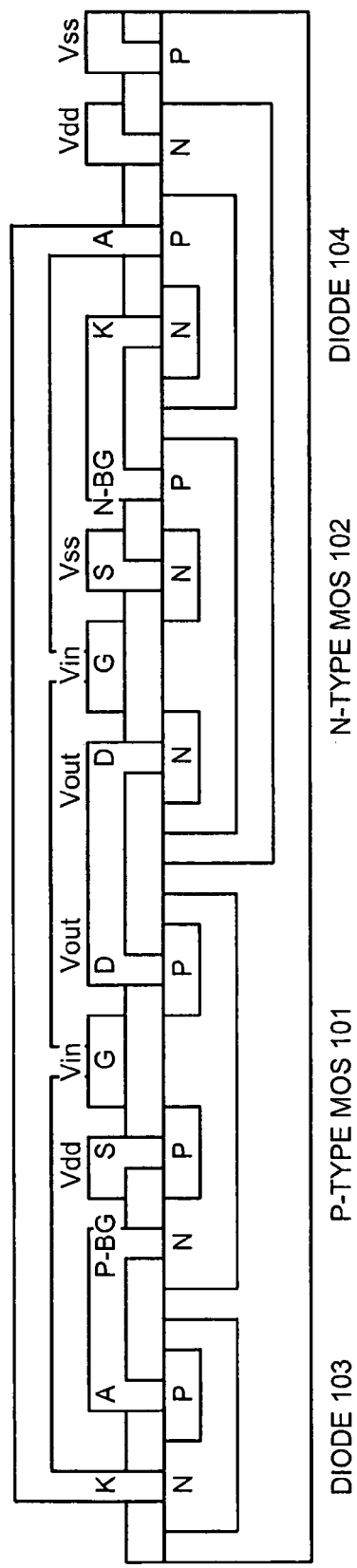
FIG. 2 is a schematic diagram of a cross-sectional configuration of the inverter circuit according to the first embodiment.

FIG. 1 is a circuit diagram of a configuration of an inverter circuit according to a first embodiment of the present invention. The inverter circuit depicted in FIG. 1 includes a P-type MOS transistor (hereinafter, "P-type MOS") 101, an N-type MOS transistor (hereinafter, "N-type MOS") 102, a diode 103, and a diode 104. FIG. 2 is a schematic diagram of a cross-sectional configuration of the inverter circuit depicted in FIG. 1.

In the P-type MOS 101, a gate terminal (denoted as "G" in FIG. 2) is connected to an input terminal, a source terminal (denoted as "S" in FIG. 2) is connected to the positive power source potential Vdd, and a drain terminal (denoted as "D" in FIG. 2) is connected to an output terminal and to a drain terminal of the N-type MOS 102. A back gate terminal of the P-type MOS 101 (denoted as "P-BG" in FIG. 2) is connected to an anode side (denoted as "A" in FIG. 2) of the diode 103. The P-type MOS 101 becomes an operating state when an input voltage Vin applied to the gate terminal is L (low), and passes a current from the source terminal to the drain terminal, and sets an output voltage Vout from the output terminal to H (high).

In the N-type MOS 102, a gate terminal is connected to the input terminal, a source terminal is connected to the negative power source potential Vss, and a drain terminal is connected to the output terminal and to the drain terminal of the P-type MOS 101. A back gate terminal of the N-type MOS 102 is connected to a cathode side (denoted as "K" in FIG. 2) of the diode 104. The N-type MOS 102 becomes an operating state when the input voltage Vin applied to the gate terminal is H (high), and passes a current from the drain terminal to the source terminal, and sets the output voltage Vout from the output terminal to L (low).

The diode 103 becomes an on-state when the P-type MOS 101 is in an operating state, and sets a voltage at an anode side to a voltage higher than the input voltage Vin. Therefore, based on the diode 103, a back gate voltage of the P-type MOS 101 becomes lower than the source voltage, and an absolute value of the threshold voltage becomes small. As a result, when the P-type MOS 101 is in an operating state, a driving current can be increased. The diode 103 becomes an off-state when the P-type MOS 101 is in a non-operating state. Therefore, when the P-type MOS 101 is in a non-operating state, a leak current can be suppressed without reducing the absolute value of the threshold voltage.

The diode 104 becomes an on-state when the N-type MOS 102 is in an operating state, and sets a voltage at a cathode side to a voltage lower than the input voltage Vin. Therefore, based on the diode 104, a back gate voltage of the N-type MOS 102 becomes higher than the source voltage, and an absolute value of the threshold voltage becomes small. As a result, when the N-type MOS 102 is in an operating state, a driving current can be increased. The diode 104 becomes an off-state when the N-type MOS 102 is in a non-operating state. Therefore, when the N-type MOS 102 is in a non-operating state, a leak current can be suppressed without reducing the absolute value of the threshold voltage.

Figure 3:
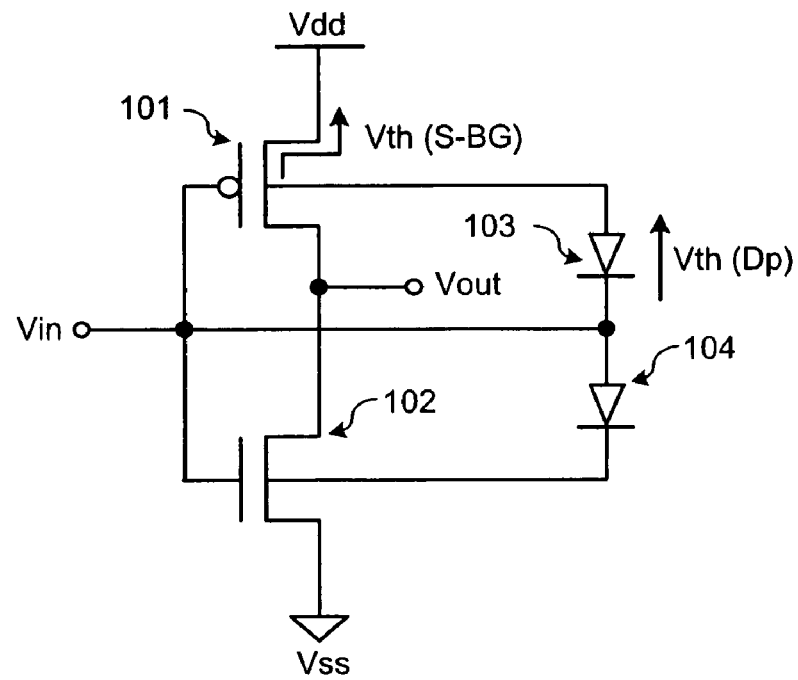
FIG. 3 is a schematic diagram for explaining an operation of the inverter circuit according to the first embodiment.

FIG. 3 is a schematic diagram for explaining an operation of the inverter circuit according to the first embodiment. In FIG. 3, the P-type MOS 101 is in an operating state.

When the P-type MOS 101 is in an operating state, that is, when the input voltage Vin is L (low), the diode 103 becomes an on-state, and the back gate voltage of the P-type MOS 101 becomes a voltage having a threshold voltage Vth (Dp) of the diode 103 added to the input voltage Vin. When the following equation (1) is satisfied, the absolute value of the threshold voltage of the P-type MOS 101 becomes small, and the driving current increases, without passing a current from the source terminal to the back gate terminal.

$$Vin+Vth(Dp)>Vdd-Vth(S-BG) \quad (1)$$

In the equation (1), as depicted in FIG. 3, Vth(S–BG) denotes a voltage between the source terminal and the back gate terminal.

Similarly, when the N-type MOS 102 is in an operating state, that is, when the input voltage Vin is H (high), the diode 104 becomes an on-state, and the back gate voltage of the N-type MOS 102 becomes equal to or smaller than a voltage having a threshold voltage Vth (Dn) of the diode 104 subtracted from the input voltage Vin. When the following equation (2) is satisfied, the absolute value of the threshold voltage of the N-type MOS 102 becomes small, and the driving current increases, without passing a current from the back gate terminal to the source terminal.

$$Vin-Vth(Dn)<Vth(S-BG)+Vss \quad (2)$$

As explained above, according to the first embodiment, the diode 103 and the diode 104 shift the back gate voltages of the P-type MOS 101 and the N-type MOS 102 corresponding to the input voltages Vin. Therefore, the driving currents of the P-type MOS 101 and the N-type MOS 102 can be increased without generating a current between the source terminal and the back gate terminal.

[b] Second Embodiment

According to a second embodiment of the present invention, a MOS transistor is connected to a diode, whereby a back gate voltage of a MOS transistor in a non-operating state is controlled to stabilize the operation.

Figure 4:
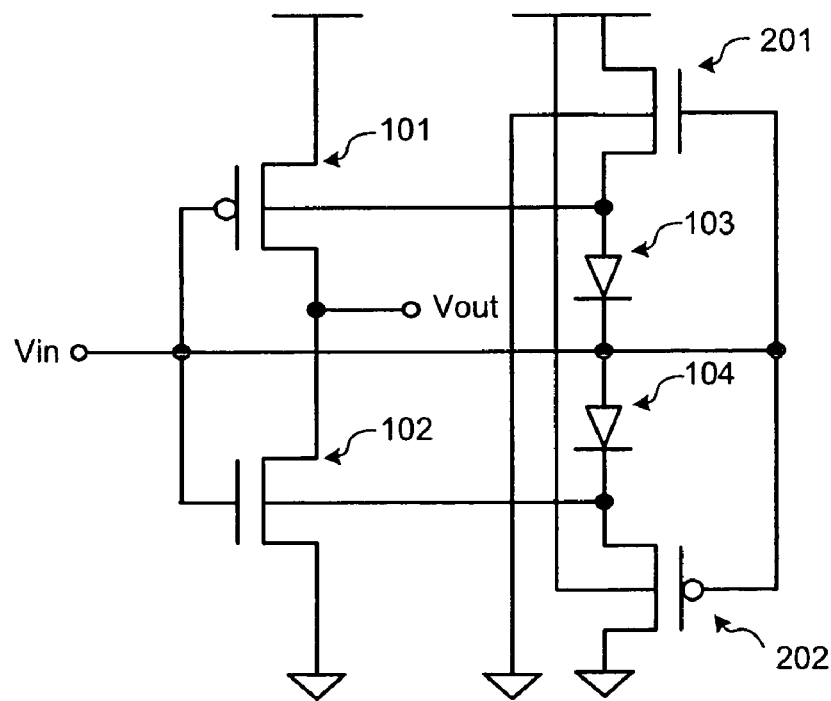
FIG. 4 is a circuit diagram of a configuration of an inverter circuit according to a second embodiment of the present invention.

FIG. 4 is a circuit diagram of a configuration of an inverter circuit according to the second embodiment. In FIG. 4, like parts as those in FIG. 1 are denoted by like reference numerals and explanations thereof will not be repeated. The inverter circuit depicted in FIG. 4 includes the P-type MOS 101, the N-type MOS 102, the diode 103, the diode 104, an N-type MOS 201, and a P-type MOS 202.

In the N-type MOS 201, a gate terminal is connected to an input terminal, a source terminal is connected to a back gate terminal of the P-type MOS 101, and a drain terminal is connected to the positive power source potential Vdd. A back gate terminal of the N-type MOS 201 is connected to the negative power source potential Vss. The N-type MOS 201 becomes an operating state when the input voltage Vin applied to the gate terminal is H (high), and passes a current from the drain terminal to the source terminal, and sets the back gate voltage of the P-type MOS 101 equal to Vdd. That is, when the P-type MOS 101 is in a non-operating state, the N-type MOS 201 sets the source voltage and back gate voltage of the P-type MOS 101 equal.

In the P-type MOS 202, a gate terminal is connected to the input terminal, a source terminal is connected to a back gate terminal of the N-type MOS 102, and a drain terminal is connected to the negative power source potential Vss. A back gate terminal of the P-type MOS 202 is connected to the positive power source potential Vdd. The P-type MOS 202 becomes an operating state when the input voltage Vin applied to the gate terminal is L (low), and passes a current from the source terminal to the drain terminal, and sets the back gate voltage of the N-type MOS 102 equal to Vss. That is, when the N-type MOS 102 is in a non-operating state, the P-type MOS 202 sets the source voltage and back gate voltage of the N-type MOS 102 equal.

In the second embodiment, the N-type MOS 201 and the P-type MOS 202 are added to the circuit of the first embodiment. In the circuit (FIG. 1) of the first embodiment, the diode 103 and the diode 104 are provided. With this arrangement, when the P-type MOS 101 and the N-type MOS 102 corresponding to these diodes are in an operating state, the driving current can be increased. However, in the first embodiment, when the P-type MOS 101 and the N-type MOS 102 are in a non-operating state, the back gate terminals of the respective MOS transistors become a floating state that power is not supplied, and the operation becomes unstable.

Therefore, in the second embodiment, the N-type MOS 201 and the P-type MOS 202 are connected to the diode 103 and the diode 104, respectively. When the diode 103 is in an off-state, the N-type MOS 201 supplies positive power to the back gate terminal of the P-type MOS 101. When the diode 104 is in an off-state, the P-type MOS 202 supplies negative power to the back gate terminal of the N-type MOS 102.

With this arrangement, when the P-type MOS 101 and the N-type MOS 102 are in a non-operating state, the back gate voltage becomes equal to the source voltage, and the circuit operation becomes stable. Further, a threshold voltage in a non-operating state of the P-type MOS 101 and the N-type MOS 102 becomes large, and a leak current can be reduced to a state before the driving capacity is improved.

Figure 5:
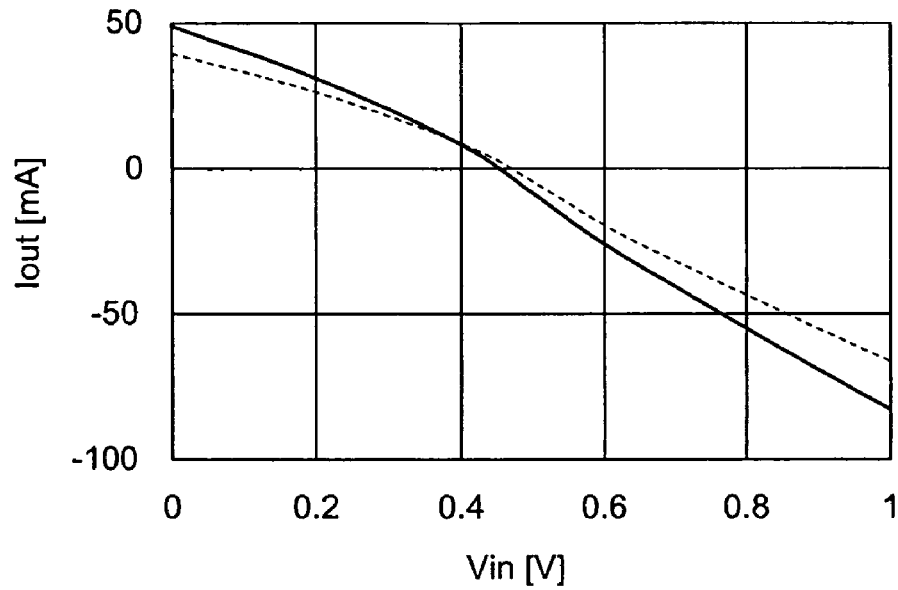
FIG. 5 depicts a relationship between an input voltage and an output current.

FIG. 5 depicts a relationship between the input voltage Vin and an output current Iout output from the output terminal, for the inverter circuit (a solid line) according to the second embodiment and a conventional inverter circuit (a broken line). As depicted in FIG. 5, along with the increase of the input voltage Vin from 0 to 1, the output current Iout is reduced. In the inverter circuit expressed by the solid line in FIG. 5, an absolute value of the output current Iout is larger than that in the conventional inverter circuit expressed by the broken line in FIG. 5. That is, when the input voltage Vin is 0, for example, the output current Iout is in a positive value, and the output current Iout is larger in the inverter circuit according to the second embodiment expressed by the solid line. When the input voltage Vin is 1, the output current Iout is in a negative value, and the output current Iout in the inverter circuit according to the second embodiment expressed by the solid line is smaller. This indicates that the inverter circuit of the second embodiment can obtain a larger driving current than the conventional inverter circuit.

Figure 6:
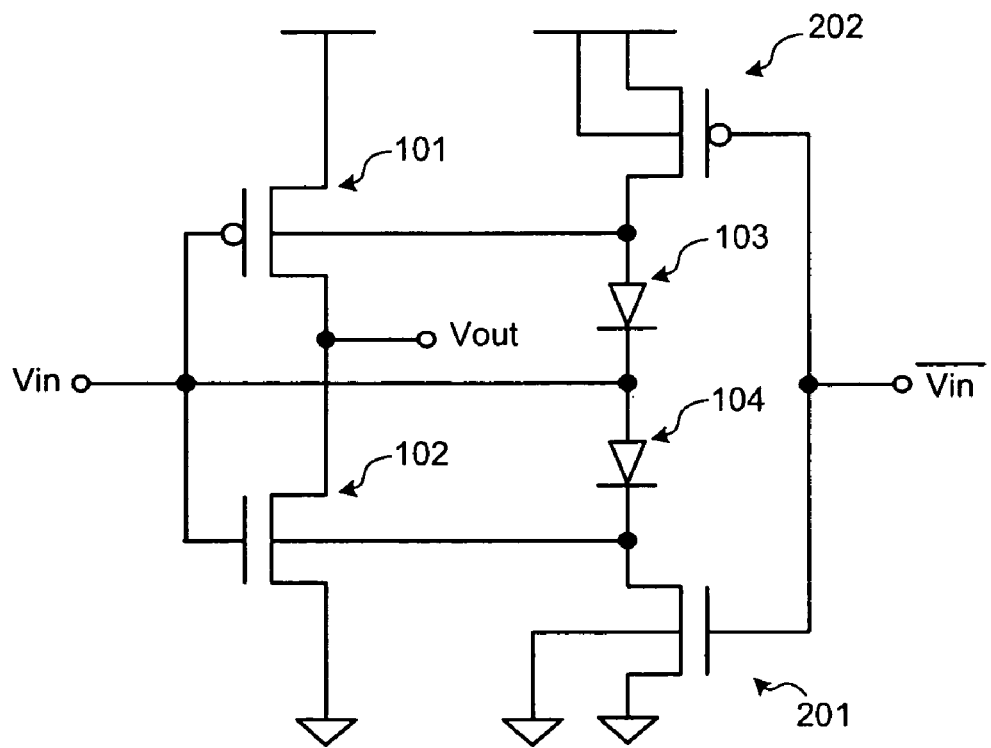
FIG. 6 is a circuit diagram of a configuration of another inverter circuit according to the second embodiment.

Various variations are considered for the inverter circuit according to the second embodiment. First, as depicted in FIG. 6, a differential-input-voltage Vin bar can be input instead of the input voltage Vin, to the gate terminals of the N-type MOS 201 and the P-type MOS 202. In FIG. 6, because the differential-input-voltage Vin bar having the input voltage Vin inverted is applied to the gate terminals of the N-type MOS 201 and the P-type MOS 202, a positional relationship between the N-type MOS 201 and the P-type MOS 202 can be reversed from that in the circuit configuration depicted in FIG. 4. As a result, in the circuit configuration depicted in FIG. 6, P-type MOS transistors (the P-type MOS 101 and the P-type MOS 202) can be arranged at an upper part of the diagram, and N-type MOS transistors (the N-type MOS 102 and the N-type MOS 201) can be arranged at a lower part of the diagram, thereby improving the usability of the circuit.

Figure 7:
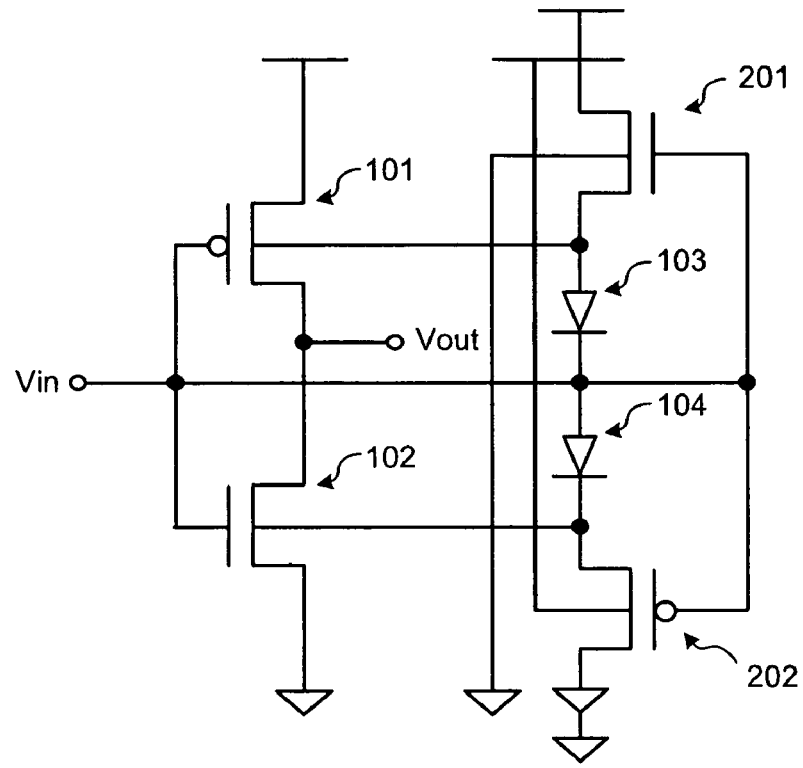
FIG. 7 is a circuit diagram of a configuration of still another inverter circuit according to the second embodiment.

Next, as depicted in FIG. 7, the positive power source potential and the negative power source potential connected to the drain terminals of the N-type MOS 201 and the P-type MOS 202 can be set deeper than the positive power source potential Vdd and the negative power source potential Vss, respectively. That is, the positive power source potential connected to the drain terminal of the N-type MOS 201 can be set larger than the positive power source potential Vdd, and the negative power source potential connected to the drain terminal of the P-type MOS 202 can be set smaller than the negative power source potential Vss. With this arrangement, the threshold voltage when the P-type MOS 101 and the N-type MOS 102 are in a non-operating state can be larger, whereby the leak current can be suppressed more securely.

Figure 8:
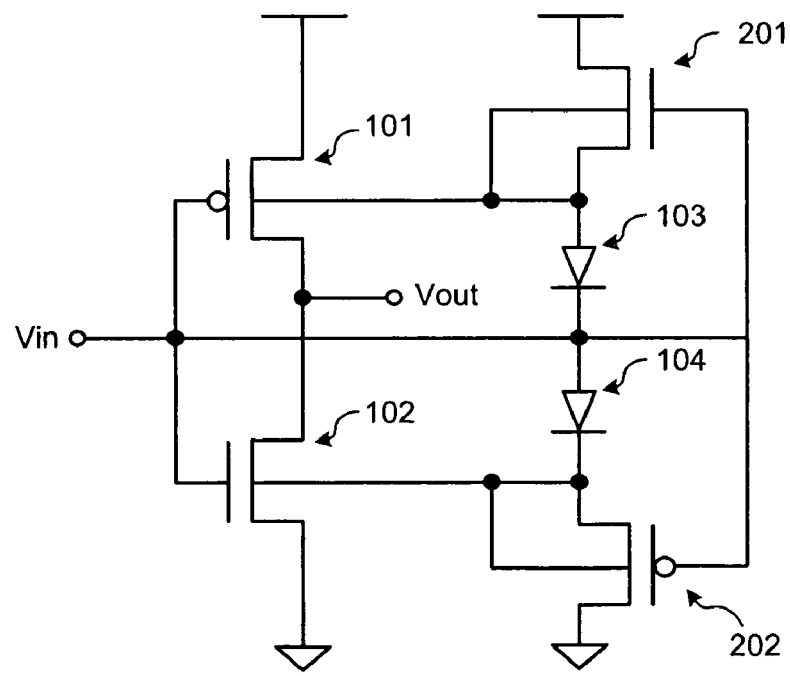
FIG. 8 is a circuit diagram of a configuration of still another inverter circuit according to the second embodiment.

Further, as depicted in FIG. 8, the back gate voltages of the N-type MOS 201 and the P-type MOS 202 can be obtained from the back gate voltages of the P-type MOS 101 and the N-type MOS 102, respectively. With this arrangement, a timing when the N-type MOS 201 and the P-type MOS 202 become an operating state can be changed, thereby controlling a timing of matching the source voltage and the back gate voltage of the P-type MOS 101 and the N-type MOS 102.

Figure 9:
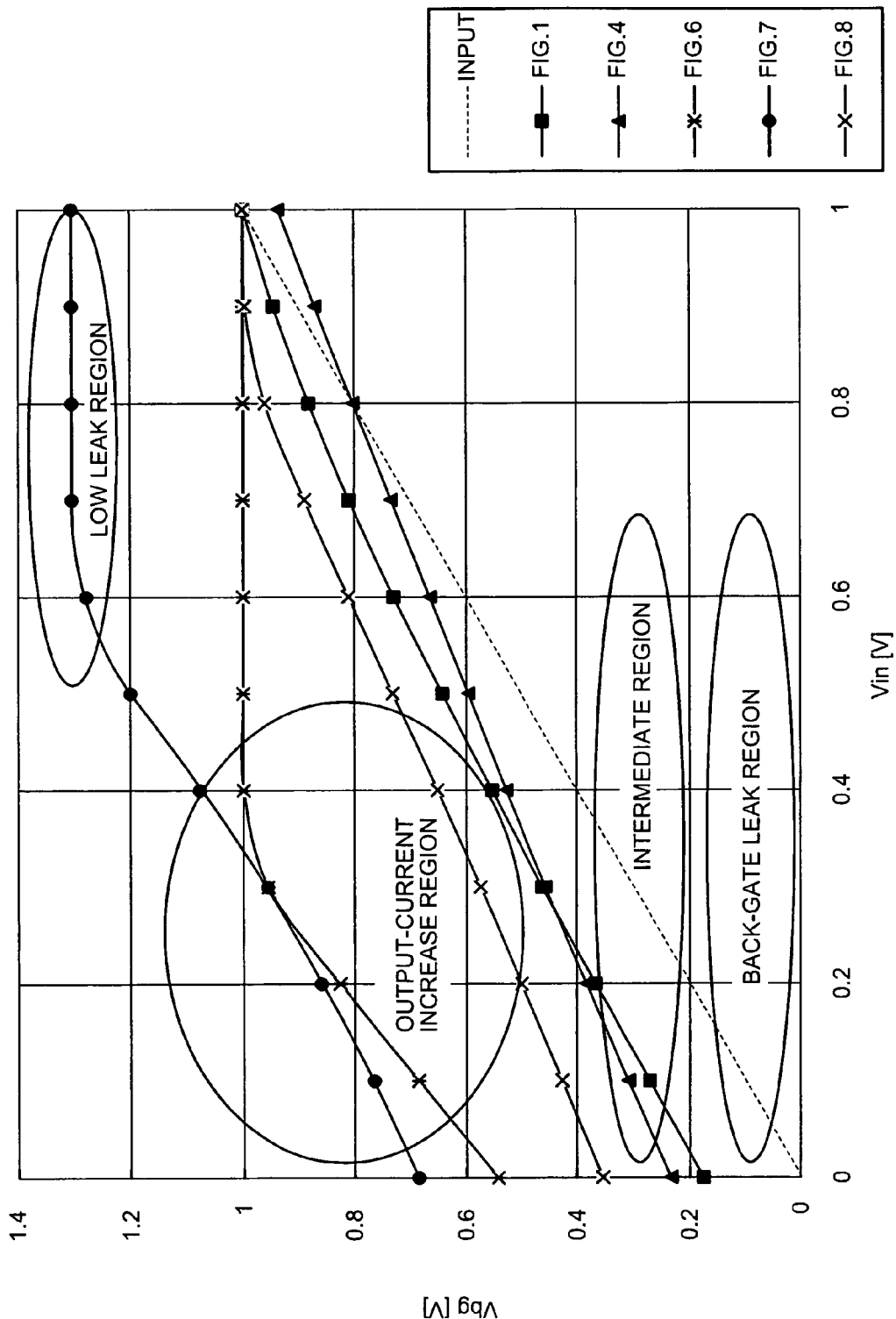
FIG. 9 depicts characteristics of an input voltage and a back gate voltage in a P-type MOS.

FIG. 9 depicts characteristics of the input voltage Vin and a back gate voltage Vbg in the P-type MOS 101 of the inverter circuit (FIG. 1) according to the first embodiment, and the inverter circuits (FIGS. 4, 6, 7, and 8) according to the second embodiment. In FIG. 9, application of the input voltage Vin to the back gate terminal is expressed by a broken line. As is clear from FIG. 9, in all inverter circuits depicted in FIGS. 1, 4, 6, 7, and 8, in a state that the input voltage Vin is low, the back gate voltage Vbg is larger than the input voltage Vin. That is, it is clear that in the P-type MOS 101, when the input voltage Vin is L (low), the threshold voltage becomes high, and the driving voltage increases.

In a state that the input voltage Vin is small, characteristics of all inverter circuits do not belong to a back-gate leak region where a leak current to the back gate terminal is large, but belong to an intermediate region where a driving current is large and some current is leaked to the back gate terminal, or belong to an output-current increase region where a driving current is large. When the input voltage Vin becomes larger, it is clear that, in the characteristics of all inverter circuits, the back gate voltage becomes close to a constant value (1V), and the leak current becomes similar to that of the conventional inverter circuit. However, in the circuit depicted in FIG. 7, because the positive power source potential connected to the drain terminal of the N-type MOS 201 is set larger, the back gate voltage of the P-type MOS 101 becomes larger, and the leak current is further reduced than normal.

As explained above, according to the second embodiment, MOS transistors are provided between the back gate terminals of the P-type MOS 101 and the N-type MOS 102 and the positive power source and the negative power source, respectively. Therefore, when the P-type MOS 101 and the N-type MOS 102 are in a non-operating state, respectively, the source voltage and the back gate voltage match each other, and the operation of the inverter circuit can be stabilized.

[c] Third Embodiment

According to a third embodiment of the present invention, a current flowing through a diode is led to a positive power source or a negative power source. With this arrangement, the current flowing through the diode is prevented from flowing to the input terminal.

In the inverter circuits according to the first and second embodiments, the cathode side of the diode 103 is connected to the input terminal. Therefore, when the diode 103 becomes an on-state, a current flows to the input terminal. Accordingly, this has a risk of putting a burden on a pre-stage circuit of the inverter circuit. In the third embodiment, a transistor functions as a diode, and a current flowing through the diode is not led to the input terminal, based on switching performed by MOS transistors.

Figure 10:
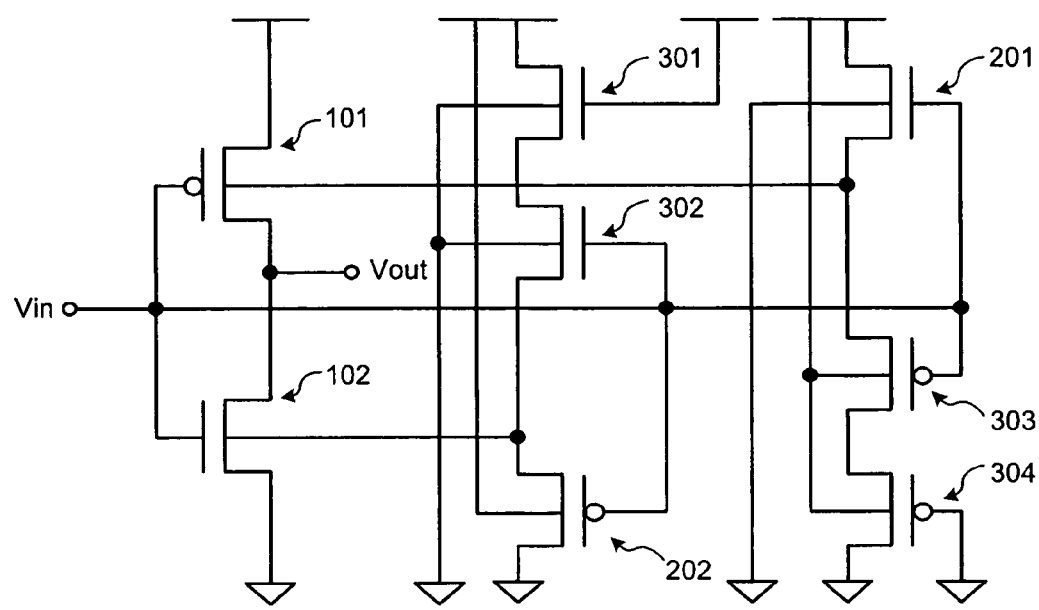
FIG. 10 is a circuit diagram of a configuration of an inverter circuit according to a third embodiment of the present invention.

FIG. 10 is a circuit diagram of a configuration of an inverter circuit according to the third embodiment. In FIG. 10, like parts as those in FIGS. 1 and 4 are denoted by like reference numerals and explanations thereof will not be repeated. The inverter circuit depicted in FIG. 10 includes the P-type MOS 101, the N-type MOS 102, the N-type MOS 201, the P-type MOS 202, a diode 301, an N-type MOS 302, a P-type MOS 303, and a diode 304.

The diode 301 includes an N-type MOS. A gate terminal is connected to the positive power source potential Vdd. A source terminal is connected to a drain terminal of the N-type MOS 302. A drain terminal is connected to the positive power source potential Vdd. A back gate terminal is connected to the negative power source potential Vss. The diode 301 works to set a voltage of a drain terminal of the N-type MOS 302 to a voltage lower than the positive power source potential Vdd. That is, the diode 301 has a function equivalent to that of the diodes 104 according to the first and second embodiments.

In the N-type MOS 302, a gate terminal is connected to an input terminal. A source terminal is connected to the back gate terminal of the N-type MOS 102. A drain terminal of the N-type MOS 302 is connected to the source terminal of the diode 301. A back gate terminal of the N-type MOS 302 is connected to the negative power source potential Vss. Therefore, the N-type MOS 302 and the P-type MOS 202 have configurations similar to that of a buffer circuit that passes the input voltage Vin as it is.

The N-type MOS 302 becomes an operating state when the input voltage Vin is H (high), and functions as a switch that connects between the diode 301 and the back gate terminal of the N-type MOS 102. On the other hand, the N-type MOS 302 becomes a non-operating state when the input voltage Vin is L (low). The diode 301 does not apply a voltage reduced from the positive power source potential Vdd to the back gate terminal of the N-type MOS 102.

In the P-type MOS 303, a gate terminal is connected to an input terminal. A source terminal of the P-type MOS 303 is connected to the back gate terminal of the P-type MOS 101. A drain terminal is connected to a source terminal of the diode 304. A back gate terminal of the P-type MOS 303 is connected to the positive power source potential Vdd. Therefore, the P-type MOS 303 and the N-type MOS 201 have configurations similar to that of a buffer circuit that passes the input voltage Vin as it is.

The P-type MOS 303 becomes an operating state when the input voltage Vin is L (low), and functions as a switch that connects between the diode 304 and the back gate terminal of the P-type MOS 101. On the other hand, the P-type MOS 303 becomes a non-operating state when the input voltage Vin is H (high). The diode 304 does not apply a voltage increased from the negative power source potential Vss to the back gate terminal of the P-type MOS 101.

The diode 304 includes a P-type MOS. A gate terminal is connected to the negative power source potential Vss. A source terminal is connected to the drain terminal of the P-type MOS 303. A drain terminal is connected to the negative power source potential Vss. A back gate terminal is connected to the positive power source potential Vdd. The diode 304 works to set a voltage of the drain terminal of the P-type MOS 303 to a voltage higher than the negative power source potential Vss. That is, the diode 304 has a function equivalent to that of the diodes 103 according to the first and second embodiments.

In the third embodiment, based on switching performed using the N-type MOS 302 and the P-type MOS 303, whether to apply voltages from the diode 301 and the diode 304 to the back gate terminals of the N-type MOS 102 and the P-type MOS 101 is switched. Further, it is also obviously possible to use an analog switch that operates in a similar manner to the N-type MOS 302 and the P-type MOS 303. It is also possible to replace the N-type MOS 201 and the P-type MOS 202 with a circuit that performs switching.

It is also possible to use a toggle switch or the like that connects the back gate terminal of the P-type MOS 101 to any one of the N-type MOS 201 and the P-type MOS 303 by switching. Similarly, it is also possible to use a toggle switch that connects the back gate terminal of the N-type MOS 102 to any one of the P-type MOS 202 and the N-type MOS 302 by switching.

In the third embodiment, when the input voltage Vin is L (low), the P-type MOS 101, the P-type MOS 202, the P-type MOS 303, and the diode 304 become an operating state. Because the diode 304 and the P-type MOS 303 become an operating state, the back gate voltage of the P-type MOS 101 becomes a voltage larger than the negative power source potential Vss by a threshold voltage of the diode 304. Accordingly, a leak current from the source terminal of the P-type MOS 101 to the back gate terminal can be suppressed, and the driving current can be increased. Further, because the P-type MOS 202 becomes an operating state, the source voltage and the back gate voltage of the N-type MOS 102 match the negative power source potential Vss in a similar manner to that of the second embodiment, and the operation becomes stable.

On the other hand, when the input voltage Vin is H (high), the N-type MOS 102, the N-type MOS 201, the diode 301, and the N-type MOS 302 become an operating state. Further, because the diode 301 and the N-type MOS 302 become an operating state, the back gate voltage of the N-type MOS 102 becomes a voltage smaller than the positive power source potential Vdd by a threshold voltage of the diode 301. Accordingly, a leak current from the source terminal of the N-type MOS 102 to the back gate terminal can be suppressed, and the driving current can be increased. Because the N-type MOS 201 becomes an operating state, the source voltage and the back gate voltage of the P-type MOS 101 match the positive power source potential Vdd in a similar manner to that of the second embodiment, and the operation becomes stable.

In the inverter circuit according to the third embodiment, the input terminal is connected to only the gate terminals of the MOS transistors, and a current does not flow from the diode and the like into the input terminal. Therefore, the driving current is not wastefully consumed and a high speed operation can be performed.

Figure 11:
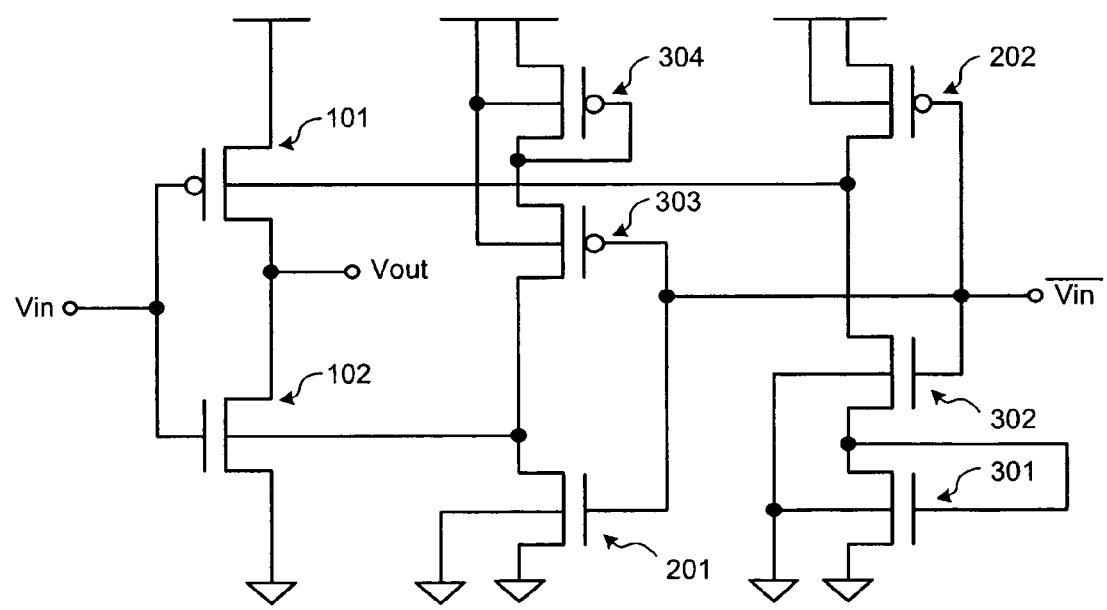
FIG. 11 is a circuit diagram of a configuration of another inverter circuit according to the third embodiment.

Various variations are considered for the inverter circuit according to the third embodiment, in a similar manner to that of the second embodiment. Firstly, as depicted in FIG. 11, the differential-input-voltage Vin bar can be input instead of the input voltage Vin, to the gate terminals of the N-type MOS 201 and the P-type MOS 202. In FIG. 11, because the differential-input-voltage Vin bar having the input voltage Vin inverted is applied to the gate terminals of the N-type MOS 201 and the P-type MOS 202, a positional relationship between the N-type MOS 201 and the P-type MOS 202 can be reversed from that in the circuit configuration depicted in FIG. 10. Following this, the positional relationship among the diode 301, the N-type MOS 302, the P-type MOS 303, and the diode 304 can be reversed. As a result, in the circuit configuration depicted in FIG. 11, P-type MOS transistors (the P-type MOS 101, the P-type MOS 202, the P-type MOS 303, and the diode 304) can be arranged at an upper part of the diagram, and N-type MOS transistors (the N-type MOS 102, the N-type MOS 201, the diode 301, and the N-type MOS 302) can be arranged at a lower part of the diagram, thereby improving the usability of the circuit.

Figure 12:
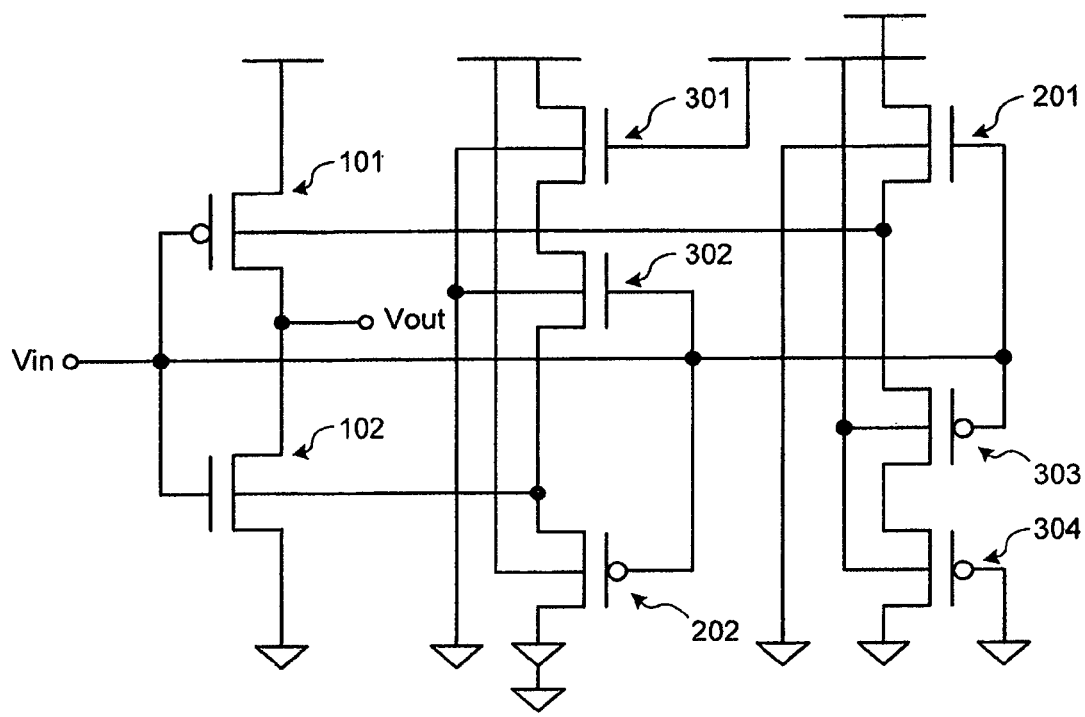
FIG. 12 is a circuit diagram of a configuration of still another inverter circuit according to the third embodiment.

Next, as depicted in FIG. 12, the positive power source potential and the negative power source potential connected to the drain terminals of the N-type MOS 201 and the P-type MOS 202 can be set deeper than the positive power source potential Vdd and the negative power source potential Vss, respectively. That is, the positive power source potential connected to the drain terminal of the N-type MOS 201 can be set larger than the positive power source potential Vdd, and the negative power source potential connected to the drain terminal of the P-type MOS 202 can be set smaller than the negative power source potential Vss. With this arrangement, the threshold voltage when the P-type MOS 101 and the N-type MOS 102 are in a non-operating state can be larger, whereby the leak current can be suppressed more securely.

As explained above, according to the third embodiment, the P-type MOS transistors and the N-type MOS transistors are used to provide a circuit configuration in which a current to adjust the back gate voltages of the P-type MOS 101 and the N-type MOS 102 does not flow into the input terminal. Therefore, the driving current is not wastefully consumed and a high speed operation can be performed.

Figure 13:
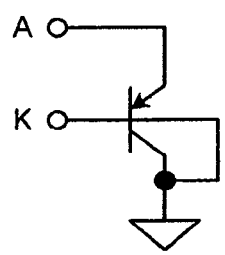
FIG. 13 is a specific configuration example of a diode.

Transistors having configurations as depicted in FIG. 13 to FIG. 17 can be also used for the diode 301 and the diode 304 according to the third embodiment. In FIG. 13 to FIG. 17, an anode side of the diode is denoted by "A", and a cathode side is denoted by "K". FIG. 13 depicts a PNP (Positive-Negative-Positive) transistor. When this transistor is used as the diode 301, an emitter terminal becomes the anode side, and a base terminal becomes the cathode side. A collector terminal is connected to the negative power source potential Vss. Although illustrations are omitted, when an NPN (Negative-Positive-Negative) transistor is used as the diode 304, a base terminal becomes the anode side, and an emitter terminal becomes the cathode side. The collector terminal is connected to the positive power source potential Vdd.

Figure 14:
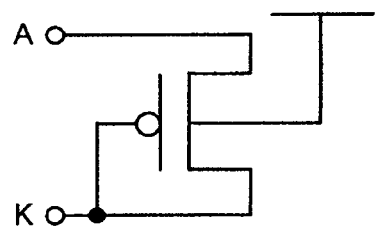
FIG. 14 is another specific configuration example of the diode.

FIG. 14 depicts a P-type MOS transistor, and this transistor is used as the diode 304. In this case, a source terminal becomes the anode side. A gate terminal and a drain terminal are connected together at the cathode side. A back gate terminal of the P-type MOS transistor is connected to the positive power source potential Vdd.

Figure 15:
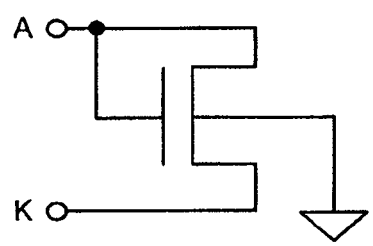
FIG. 15 is still another specific configuration example of the diode.

FIG. 15 depicts an N-type MOS transistor, and this transistor is used as the diode 301. In this case, the gate terminal and the drain terminal are connected at the anode side. A source terminal becomes the cathode side, and a back gate terminal of the N-type MOS transistor is connected to the negative power source potential Vss.

Figure 16:
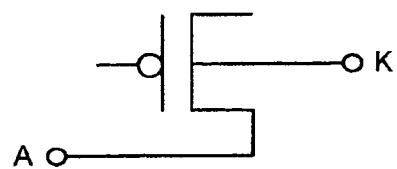
FIG. 16 is still another specific configuration example of the diode.
Figure 17:
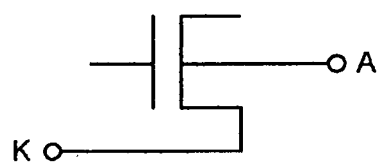
FIG. 17 is still another specific configuration example of the diode.

FIG. 16 depicts a P-type MOS junction transistor, and this transistor is used as the diode 304. In this case, a back gate terminal of the P-type MOS junction transistor becomes the cathode side, and a drain terminal becomes the anode side. Similarly, FIG. 17 depicts an N-type MOS junction transistor, and this transistor is used as the diode 301. In this case, a back gate terminal of the N-type MOS junction transistor becomes the anode side, and a source terminal becomes the cathode side.

[d] Fourth Embodiment

According to a fourth embodiment of the present invention, the arrangements of the MOS transistors functioning as a buffer circuit and a diode in the circuit in the third embodiment are replaced to have a large operation margin of the entire circuit.

Figure 18:
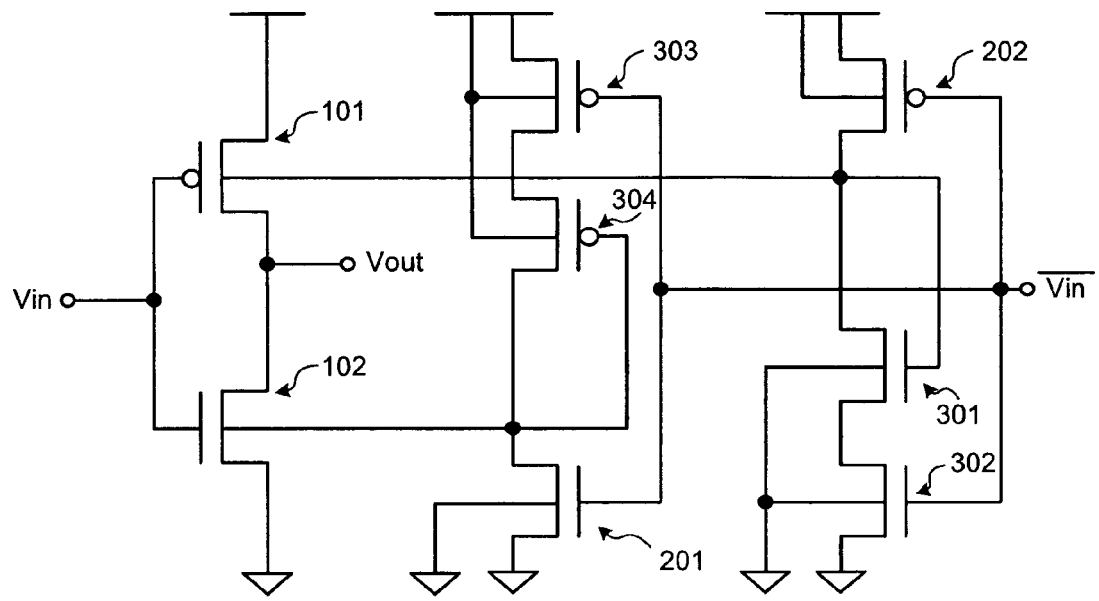
FIG. 18 is a circuit diagram of a configuration of an inverter circuit according to a fourth embodiment of the present invention.

FIG. 18 is a circuit diagram of a configuration of an inverter circuit according to the fourth embodiment. In FIG. 18, like parts as those in FIGS. 1, 4, and 10 are denoted by like reference numerals and explanations thereof will not be repeated. In the circuit depicted in FIG. 18, positions of the P-type MOS 303 and the diode 304 in the third embodiment depicted in FIG. 11 are replaced with each other, and positions of the diode 301 and the N-type MOS 302 are replaced with each other. Other aspects are identical to those of the third embodiment, except that the operation margin becomes large based on the configuration of the circuit in the fourth embodiment.

In FIG. 18, the differential-input-voltage Vin bar is input to the gate terminals of the N-type MOS 201 and the P-type MOS 202. However, the positional relationship between the N-type MOS and the P-type MOS can be reversed, and the input voltage Vin can be used, in a similar manner to that of the second and third embodiments. When the differential-input-voltage Vin bar is used, the N-type MOS transistor can be arranged at the negative power source potential Vss side, and the P-type MOS transistor can be arranged at the positive power source potential Vdd side in a similar manner to the third embodiment, thereby improving the usability of the circuit.

Figure 19:
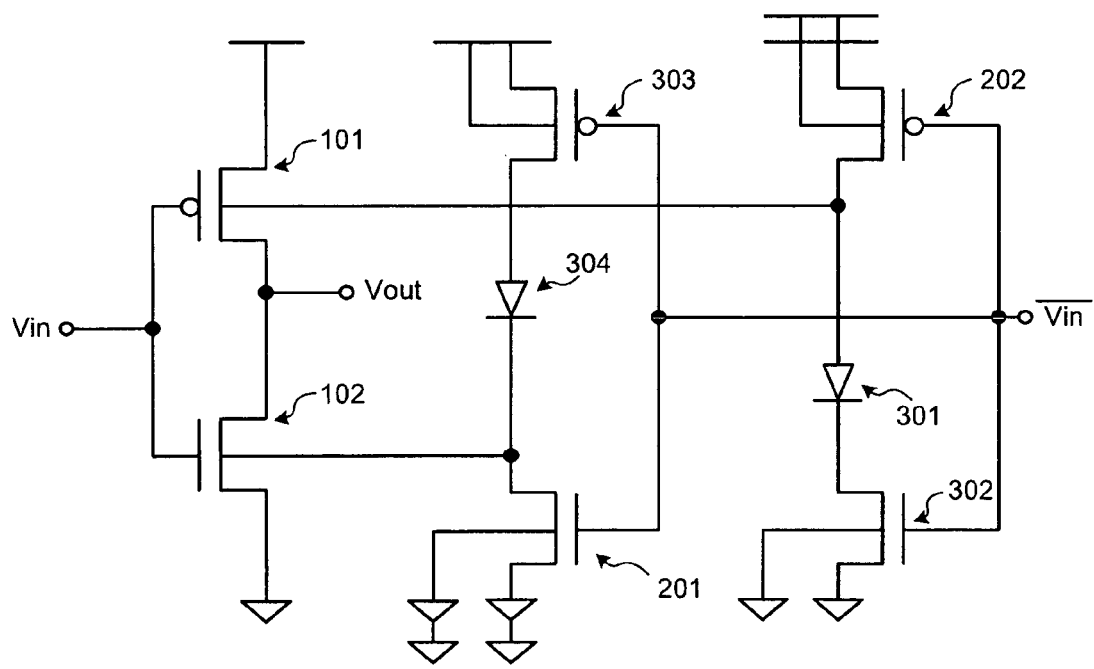
FIG. 19 is a circuit diagram of a configuration of another inverter circuit according to the fourth embodiment.

Further, as depicted in FIG. 19, a negative power source potential connected to the source terminal of the N-type MOS 201 can be set smaller than the negative power source potential Vss, and a positive power source potential connected to the source terminal of the P-type MOS 202 can be set larger than the positive power source potential Vdd. With this arrangement, a threshold voltage when the P-type MOS 101 and the N-type MOS 102 are in a non-operating state becomes larger, and a leak current can be more securely suppressed. In FIG. 19, the diode 301 and the diode 304 are denoted by circuit symbols of a diode instead of a MOS transistor.

Although illustrations are omitted, in FIG. 19, a negative power source potential connected to the source terminal of the N-type MOS 302 can be set smaller than the negative power source potential Vss, and a positive power source potential connected to the drain terminal of the P-type MOS 303 can be set larger than the positive power source potential Vdd. In this case, when the same negative power source potentials are connected to the source terminals of the N-type MOS 201 and the N-type MOS 302, and also when the same positive power source potentials are connected to the drain terminals of the P-type MOS 202 and the P-type MOS 303, the circuit configuration can be simplified.

[e] Fifth Embodiment

According to a fifth embodiment of the present invention, one diode in the second embodiment is provided, thereby simplifying the circuit configuration.

Figure 20:
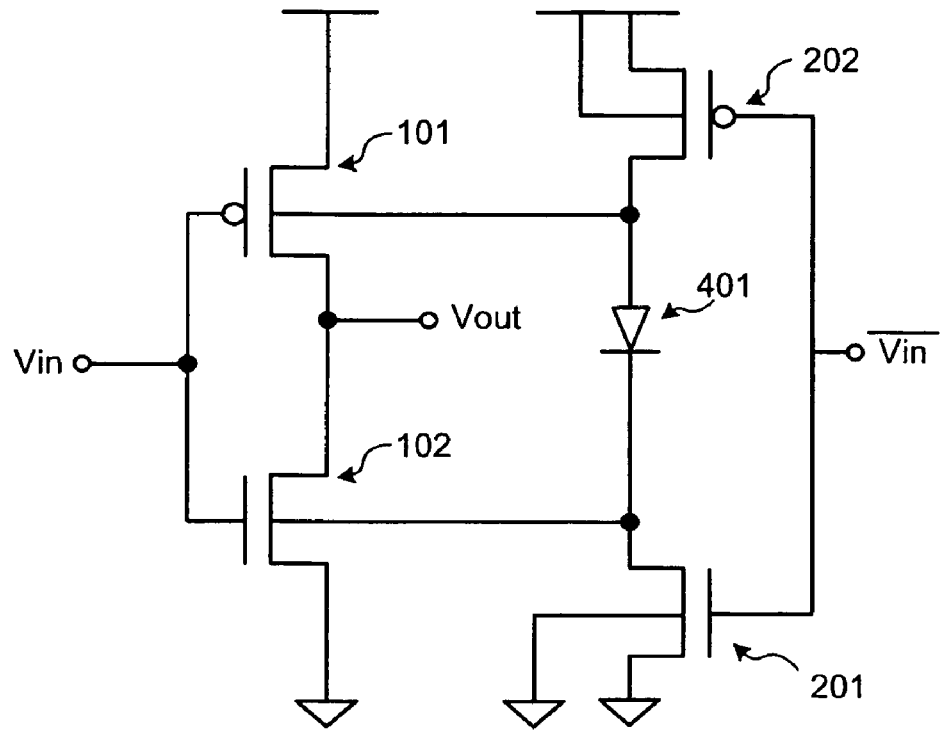
FIG. 20 is a circuit diagram of a configuration of an inverter circuit according to a fifth embodiment of the present invention.
Figure 21:
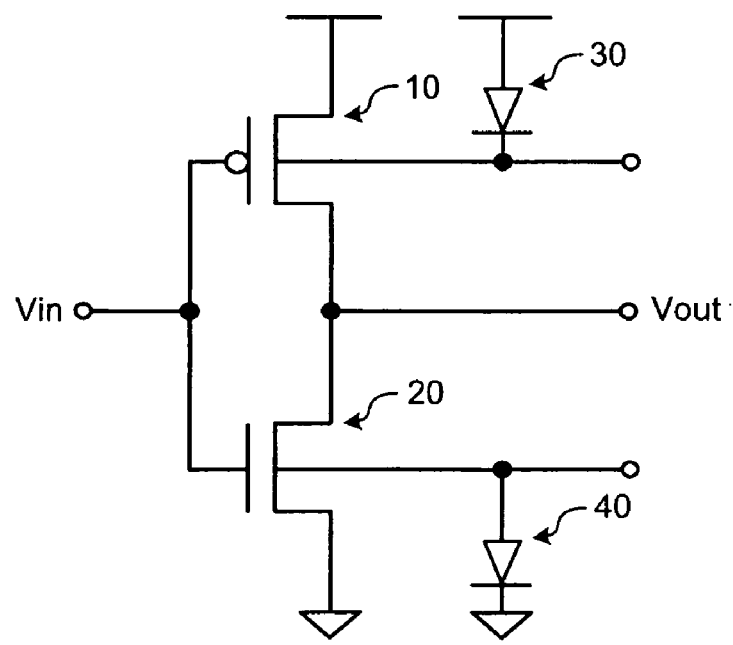
FIG. 21 is a circuit diagram of an example of a conventional inverter circuit.
Figure 22:
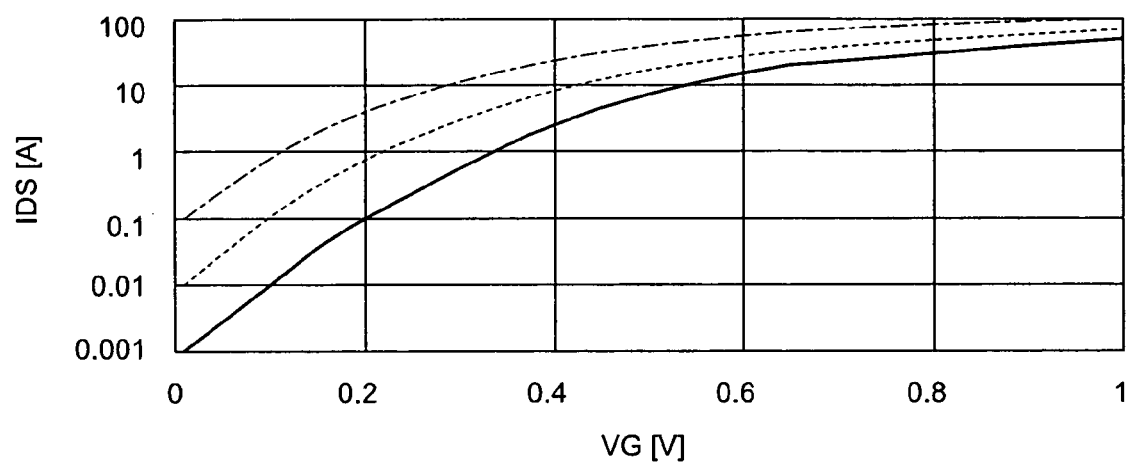
FIG. 22 depicts a relationship between a gate voltage and a current between a drain terminal and a source terminal.

FIG. 20 is a circuit diagram of a configuration of an inverter circuit according to the fifth embodiment. In FIG. 20, like parts as those in FIGS. 1 and 4 are denoted by like reference numerals and explanations thereof will not be repeated. The inverter circuit depicted in FIG. 20 includes the P-type MOS 101, the N-type MOS 102, a diode 401, the N-type MOS 201, and the P-type MOS 202.

When the P-type MOS 101 and the N-type MOS 201 are in an operating state, the diode 401 sets the back gate voltage of the P-type MOS 101 lower than the source voltage, and sets an absolute value of the threshold voltage small. When the N-type MOS 102 and the P-type MOS 202 are in an operating state, the diode 401 sets the back gate voltage of the N-type MOS 102 higher than the source voltage, and sets an absolute value of the threshold voltage small. As a result, a driving current can be increased when any one of the P-type MOS 101 and the N-type MOS 102 is in an operating state.

Also in the fifth embodiment, a leak current can be more securely suppressed by setting the positive power source potential and the negative power source potential connected by the P-type MOS 202 and the N-type MOS 201 to potentials deeper than Vdd and Vss, respectively. Further, instead of the differential-input-voltage Vin bar, the input voltage Vin can be directly applied to the gate terminals of the P-type MOS 202 and the N-type MOS 201.

In the above embodiments, while driving currents of both the P-type MOS 101 and the N-type MOS 102 are increased, it is also possible to adjust a back gate voltage of only any one of the MOS transistors. Particularly, when the back gate voltage of only the P-type MOS transistor is adjusted, the entire driving current of the circuit can be effectively increased. In addition, the adjustment of a back gate voltage similar to the above can be used for various output driver circuits using MOS transistors as well as the inverter circuit.

According to one embodiment, the diode can shift the back gate voltage of a first transistor or a second transistor corresponding to the input voltage. Accordingly, the current between the source terminal and the back gate terminal can be suppressed, and a leak current can be suppressed while the driving current is increased.

According to one embodiment, corresponding diodes can shift the back gate voltages of a first transistor and a second transistor corresponding to the input voltages. Accordingly, the driving current of the entire circuit can be further increased.

According to one embodiment, an effect identical to that described above can be achieved by using a MOS transistor which can be easily integrated.

According to one embodiment, when a first transistor or a second transistor is in a non-operating state, the source voltage and the back gate voltage of the respective transistors can be set equal. Accordingly, the operation of the circuit can be stabilized.

According to one embodiment, the back gate voltage of the P-type MOS transistor can be set larger than the input voltage, and the back gate voltage of the N-type MOS transistor can be set smaller than the input voltage. Accordingly, a current between the source terminal and the back gate terminal can be securely suppressed.

According to one embodiment, a first diode and a second diode can adjust the back gate voltages of a first P-type MOS transistor and a first N-type MOS transistor. At the same time, there can be provided a circuit configuration in which the current flowing through the first diode and the second diode does not flow into the input. Accordingly, there is no waste in the driving current and a high speed operation can be performed.

According to one embodiment, a threshold voltage when a first P-type MOS transistor and a first N-type MOS transistor are in a non-operating state becomes larger. Accordingly, a leak current can be suppressed more securely.

According to one embodiment, when the MOS transistors are used for a first diode and a second diode, the N-type MOS transistor can be arranged at the negative power source potential Vss side, the P-type MOS transistor can be arranged at the positive power source potential Vdd side, and the P-type MOS transistors and the N-type MOS transistors of the same polarities can be arranged together. Accordingly, these MOS transistors can be operated based on the power source voltage, and the circuit can be used more conveniently.

According to one embodiment, various transistors can be used for a first diode and a second diode. Accordingly, an effect identical to that described above can be obtained in a flexible circuit configuration. Further, by flexibly using transistors having different threshold voltages, back gate voltages can be adjusted more minutely.

According to one embodiment, the back gate voltage of a first transistor or a second transistor can be shifted corresponding to the input voltage in a simple configuration of using only one diode. Accordingly, a current between the source terminal and the back gate terminal can be suppressed, and a leak current can be suppressed while increasing the driving current.

According to one embodiment, the driving current is increased, and a threshold voltage when a first P-type MOS transistor and a first N-type MOS transistor are in a non-operating state becomes larger. Accordingly, a leak current can be suppressed more securely.

According to one embodiment, a first diode and a second diode can adjust the back gate voltages of a first transistor and a second transistor. At the same time, there can be provided a circuit configuration in which the current flowing through the first diode and the second diode does not flow into the input. Accordingly, there is no waste in the driving current and a high speed operation can be performed.

According to one embodiment, the diode can shift the back gate voltage of a first transistor or a second transistor corresponding to the input voltage. Accordingly, the current between the source terminal and the back gate terminal can be suppressed, and a leak current can be suppressed while the driving current is increased.

According to the embodiments, a leak current can be suppressed while a driving current is increased.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A balanced input inverter circuit comprising:
   a first P-type MOS transistor including a gate terminal connected to an input, a source terminal connected to a first power source potential, and a drain terminal connected to an output;
   a first N-type MOS transistor including a gate terminal connected to the input, a drain terminal connected to the output, and a source terminal connected to a second power source potential;
   a first inverter circuit including an input terminal connected to an inverted input, and an output terminal connected to a back gate terminal of the first N-type MOS transistor;
   a first diode connected between the first power source potential and a first power source terminal of the first inverter circuit;
   a second inverter circuit including an input terminal connected to the inverted input, and an output terminal connected to a back gate terminal of the first P-type MOS transistor; and
   a second diode connected between the second power source potential and a second power source terminal of the second inverter circuit.

2. The balanced input inverter circuit according to claim 1, wherein
   a first power source terminal of the second inverter circuit is connected to a fourth power source potential as a voltage higher than the first power source potential, and
   a second power source terminal of the first inverter circuit is connected to a third power source potential as a voltage lower than the second power source potential.

3. The inverter circuit according to claim 1, wherein
   the first diode is configured by a PNP (Positive-Negative-Positive) transistor including an emitter terminal as an anode terminal, including a base terminal as a cathode terminal, and including a collector terminal connected to the second power source potential, and
   the second diode is configured by an NPN (Negative-Positive-Negative) transistor including a base terminal as an anode terminal, including an emitter terminal as a cathode terminal, and including a collector terminal connected to the first power source potential.

4. The inverter circuit according to claim 1, wherein
   the first diode is configured by an N-type MOS transistor including a gate terminal and a drain terminal connected as an anode terminal, including a source terminal as a cathode terminal, and including a back gate terminal connected to the second power source potential, and
   the second diode is configured by a P-type MOS transistor including a source terminal as an anode terminal, including a gate terminal and a drain terminal connected as a cathode terminal, and including a back gate terminal connected to the first power source potential.

5. The inverter circuit according to claim 1, wherein
   the first diode is configured by an N-type MOS junction transistor including a back gate terminal as an anode terminal, and including a source terminal as a cathode terminal, and
   the second diode is configured by a P-type MOS junction transistor including a back gate terminal as an anode terminal, and including a drain terminal as a cathode terminal.

6. An inverter circuit comprising:
   a first transistor including a gate terminal connected to an input, a source terminal connected to a first power source potential, and a drain terminal connected to an output;

a second transistor having a polarity different from that of the first transistor and including a gate terminal connected to the input, a drain terminal connected to the output, and a source terminal connected to a second power source potential;

a first diode connected between a back gate terminal of the first transistor and a back gate terminal of the second transistor;

a third transistor including a gate terminal connected to an inverted input, a source terminal connected to the first power source potential, a drain terminal connected to the back gate terminal of the first transistor, and a back gate terminal connected to the first power source potential; and a fourth transistor including a gate terminal connected to the inverted input, a drain terminal connected to a back gate terminal of the second transistor, a source terminal connected to the second power source potential, and a back gate terminal connected to the second power source potential.

7. An inverter circuit comprising:

a first transistor including a gate terminal connected to an input, a source terminal connected to a first power source potential, and a drain terminal connected to an output;

a second transistor having a polarity different from that of the first transistor and including a gate terminal connected to the input, a drain terminal connected to the output, and a source terminal connected to a second power source potential;

a first diode connected between a back gate terminal of the first transistor and a back gate terminal of the second transistor;

a third transistor including a gate terminal connected to an inverted input, a source terminal connected to a third power source potential which is higher than the first power source potential, a drain terminal connected to the back gate terminal of the first transistor, and a back gate terminal connected to the third power source potential; and a fourth transistor including a gate terminal connected to the inverted input, a drain terminal connected to a back gate terminal of the second transistor, a source terminal connected to a fourth power source potential which is lower than the second power source potential, and a back gate terminal connected to the fourth power source potential.

* * * * *